(12) United States Patent
Schultz-Wittmann et al.

(10) Patent No.: US 9,666,732 B2
(45) Date of Patent: May 30, 2017

(54) HIGH-EFFICIENCY SOLAR CELL STRUCTURES AND METHODS OF MANUFACTURE

(71) Applicant: TETRASUN, INC., San Jose, CA (US)

(72) Inventors: Oliver Schultz-Wittmann, Sunnyvale, CA (US); Denis DeCeuster, Woodside, CA (US)

(73) Assignee: TETRASUN, INC., San Jose, CA (US)

( * ) Notice: Subject to any disclaimer, the term of this patent is extended or adjusted under 35 U.S.C. 154(b) by 0 days.

(21) Appl. No.: 14/829,999

(22) Filed: Aug. 19, 2015

(65) Prior Publication Data

US 2015/0357487 A1 Dec. 10, 2015

Related U.S. Application Data

(62) Division of application No. 13/265,462, filed as application No. PCT/US2010/031869 on Apr. 21, 2010, now Pat. No. 9,130,074.

(Continued)

(51) Int. Cl.
*H01L 31/0224* (2006.01)
*H01L 31/0216* (2014.01)
*H01L 31/18* (2006.01)

(52) U.S. Cl.
CPC .......... *H01L 31/022425* (2013.01); *H01L 31/02167* (2013.01); *H01L 31/02168* (2013.01);

(Continued)

(58) Field of Classification Search
CPC ............. H01L 21/2022; H01L 21/2026; H01L 21/02356; C30B 1/023
See application file for complete search history.

(56) References Cited

U.S. PATENT DOCUMENTS 4,481,046 A 11/1984 Bouldin et al.
4,577,393 A * 3/1986 Schmidt .............. H01L 21/2255
136/255

(Continued)

FOREIGN PATENT DOCUMENTS

EP 1 643 564 A2 4/2006
JP SHO-57-071188 A 1/1982

(Continued)

OTHER PUBLICATIONS

Schultz, O. et al., "Deielctric Rear Surface Passivation for Industrial Multicrystalline Silicon Solar Cells", 2006 IEEE 4th World Conference on Photovoltaic Energy Conversion, vol. 1, May 7-12, 2006 (pp. 885-889).

(Continued)

*Primary Examiner* — Eric R Smith
(74) *Attorney, Agent, or Firm* — Kevin P. Radigan, Esq.; Heslin Rothenberg Farley & Mesiti P.C.

(57) ABSTRACT

Solar cells of varying composition are disclosed, generally including a central substrate, conductive layer(s), antireflection layers(s), passivation layer(s) and/or electrode(s). Multifunctional layers provide combined functions of passivation, transparency, sufficient conductivity for vertical carrier flow, the junction, and/or varying degrees of anti-reflectivity. Improved manufacturing methods including single-side CVD deposition processes and thermal treatment for layer formation and/or conversion are also disclosed.

9 Claims, 12 Drawing Sheets

Related U.S. Application Data

(60) Provisional application No. 61/171,194, filed on Apr. 21, 2009.

(52) U.S. Cl.
CPC .. *H01L 31/022466* (2013.01); *H01L 31/1864* (2013.01); *H01L 31/1868* (2013.01); *H01L 31/1872* (2013.01); *H01L 31/1884* (2013.01); *Y02E 10/50* (2013.01); *Y02P 70/521* (2015.11)

(56) References Cited

U.S. PATENT DOCUMENTS

| | | | |
|---|---|---|---|
| 4,694,117 A * | 9/1987 | Friedrich | H01L 31/02168 136/256 |
| 5,131,933 A * | 7/1992 | Flodl | H01L 31/02168 136/256 |
| 5,665,607 A | 9/1997 | Kawama et al. | |
| 5,972,784 A | 10/1999 | Rohatgi et al. | |
| 6,194,763 B1 | 2/2001 | Hisamoto et al. | |
| 6,210,991 B1 | 4/2001 | Wenham et al. | |
| 6,649,956 B2 | 11/2003 | Yoshida et al. | |
| 6,821,875 B2 | 11/2004 | Wenham et al. | |
| 6,924,179 B2 | 8/2005 | Oh et al. | |
| 7,202,143 B1 | 4/2007 | Naseem et al. | |
| 2003/0092226 A1 | 5/2003 | Nagashima et al. | |
| 2003/0136440 A1 | 7/2003 | Machida et al. | |
| 2006/0213548 A1 | 9/2006 | Bachrach et al. | |
| 2007/0295399 A1 | 12/2007 | Carlson | |
| 2008/0000521 A1 | 1/2008 | Sivoththaman et al. | |
| 2008/0001169 A1 | 1/2008 | Lochtefeld | |
| 2008/0072959 A1 | 3/2008 | Chen et al. | |
| 2008/0251119 A1 | 10/2008 | Forehand et al. | |
| 2008/0311697 A1 | 12/2008 | Reber | |
| 2009/0014056 A1 | 1/2009 | Hockaday et al. | |
| 2009/0178711 A1 | 7/2009 | Joo et al. | |
| 2009/0235972 A1 * | 9/2009 | Fukushima | H01L 31/0512 136/244 |
| 2010/0075485 A1 * | 3/2010 | Rana | H01L 21/02532 438/482 |
| 2010/0105190 A1 | 4/2010 | Ferre i Tomas | |
| 2010/0136768 A1 | 6/2010 | Biro et al. | |
| 2010/0227431 A1 | 9/2010 | Rana | |
| 2012/0055547 A1 | 3/2012 | Schultz-Wittmann et al. | |

FOREIGN PATENT DOCUMENTS

| | | |
|---|---|---|
| JP | H06-111877 A | 4/1994 |
| JP | 2003-298078 A | 10/2003 |
| JP | 2006-128630 A | 5/2006 |
| WO | WO2007/125903 A1 | 11/2007 |
| WO | WO2008/028625 A2 | 3/2008 |
| WO | WO2008115814 A2 | 9/2008 |

OTHER PUBLICATIONS

DeWolf, S. et al., "Surface Passivation Properties of Boron-Doped Plasma-Enhanced Chemical Vapor Deposited Hydrogenated Amorphous Silicon Films on P-Type Crystalline Si Substrates", Applied Physics Letters, vol. 88, Issue 2, Jan. 2006 (1 page; Abstract Only).

Tucci, M. et al., "Laser Fired Back Contact for Silicon Solar Cells", Thin Solid Films, vol. 516, Issue 20, Auugst 30, 2008 (1 page; Abstract Only).

Bau et al, "Application of PECVD-SiC as Intermediate Layer in Crystalline Silicon Thin-Film Solar Cells", 3rd World Conference on Photovoltaic Energy Conversion (2003).

Schultz-Wittmann et al., International Search Report for PCT/US2010/031869, dated Aug. 18, 2010 (4 pages).

Schutlz-Wittmann et al., Patent Examination Report No. 1, for Australian Patent Application No. AU2010-239265, dated Aug. 19, 2013 (4 pages).

Schultz-Wittmann et al., Examination Report No. 2 for Australian Application No. AU2010-239265, dated Jan. 22, 2014 (3 pages).

Schultz-Wittmann et al., Patent Examination Report No. 3 for Australian Patent Application No. AU2010-239265, dated Mar. 6, 2014 (3 pages).

Schultz-Wittmann et al., Search Report for EP Application No. 10767689.2, dated Apr. 14, 2016 (7 pages).

Schultz-Wittmann et al., Extended European Search Report (EESR) for EP Application No. 10767689.2, dated Jul. 11, 2016 (12 pages).

* cited by examiner

HIGH-EFFICIENCY SOLAR CELL STRUCTURES AND METHODS OF MANUFACTURE

RELATED APPLICATION INFORMATION

This application is a divisional of U.S. Ser. No. 13/265,462, filed Oct. 20, 2011, entitled "High-Efficiency Solar Cell Structures and Methods of Manufacture", which claims the benefit of previously filed U.S. Provisional Application entitled "High-Efficiency Solar Cell Structures and Methods of Manufacture," filed Apr. 21, 2009, and assigned application No. 61/171,194, both of which are hereby incorporated herein by reference in their entirety.

TECHNICAL FIELD

The present invention relates to solar cells. More particularly, the present invention relates to improved solar cell structures and methods of their manufacture for increased cell efficiency.

BACKGROUND OF THE INVENTION

Solar cells are providing widespread benefits to society by converting essentially unlimited amounts of solar energy into useable electrical power. As their use increases, certain economic factors become important, such as high-volume manufacturing and efficiency.

High volume manufacturing is generally considered to attain a high degree of cost-effectiveness and efficiency if the number of manufacturing steps, and the complexity of each step, can be minimized.

Finished solar cell efficiencies of 20% or more are highly desired in the industry, however, known embodiments of such efficient cells often suffer from cell structure complexity and/or manufacturing complexity.

What is required therefore, are solar cells which attain high operational efficiency, and which can be manufactured in a cost effective manner.

SUMMARY OF THE INVENTION

The shortcomings of the prior art are overcome and additional advantages are provided by the present invention which in one aspect extends to any one or a combination of the solar cell structures disclosed below, including generally a central substrate, conductive layer(s), antireflection layers(s), passivation layer(s) and/or electrode(s). Multi-functional layers provide combined functions of passivation, transparency, sufficient conductivity for vertical carrier flow, the junction, and/or varying degrees of anti-reflectivity. Improved manufacturing methods including single-side CVD deposition processes and thermal treatment for layer formation and/or conversion are also disclosed.

In one aspect the present invention includes methods of fabricating any of these structures, including: providing a wafer as a central substrate; deposition or growth of interface passivation layers over the substrate; deposition of conductive layers over the passivation layers; providing thermal treatment; optional deposition of antireflective layers (possibly including back side mirrors); and providing metallization as electrodes.

In one embodiment the present invention comprises applying a heat treatment to produce a multifunctional film which separates into a surface passivating interface layer and a highly doped polycrystalline passivation layer with high transparency.

In one embodiment the present invention comprises depositing an amorphous, silicon containing compound and using a heat treatment to initiate crystallization into a polycrystalline film.

In one embodiment the present invention comprises depositing an amorphous, silicon containing compound and using a heat treatment which leads to a crystallization of the film and increases the optical transmissivity.

In one embodiment the present invention comprises depositing an amorphous, silicon containing compound and using a heat treatment in order to activate doping atoms in the compound.

In one embodiment, the present invention comprises depositing an amorphous, silicon containing compound and using a thermal treatment greater than 500° C. in order to activate doping atoms in the compound and result in diffusion of dopant atoms into a substrate wafer to provide a high-low junction or a p-n junction.

Systems and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

With reference to the energy band diagram and partial cross-sectional views of exemplary solar cells of FIGS. 1-5, solar radiation is assumed to preferentially illuminate one surface of a solar cell, usually referred to as the front side. To achieve high energy conversion efficiency of incident photons into electric energy, an efficient absorption of photons within the silicon substrate material forming the cell is important. This can be achieved by a low parasitic optical absorption of photons within all layers except the substrate itself.

For the sake of simplicity, the geometrical surface shape of layer surfaces (e.g., surface texture such as pyramids, or other surface texture, can be formed on layer surfaces) is not portrayed in these drawings, however, it is understood that the geometrical shape and/or surfaces may be textured in any shape beneficial for improved solar cell efficiency, and falls within the scope of the invention.

One important parameter for high solar cell efficiency is surface passivation. Surface passivation provides suppression of recombination of electrons and holes at or in the vicinity of certain physical surfaces within the solar cell. Surface recombination can be reduced by the application of dielectric layers. These layers reduce the interface density of states and therefore reduce the number of recombination centers. Two examples are thermally grown silicon oxide and PECVD deposited silicon nitride. Another example of a surface passivating layer is intrinsic amorphous silicon. These layers can also provide an electrical charge which reduces the number of carriers of the opposite polarity and reduces recombination rates via this mechanism. Two examples are silicon nitride and aluminum oxide.

Another method of reducing the amount of carriers of one type close to a surface is the diffusion of doping atoms either of the same or the opposite doping of the layer doping type. In this case doping levels in excess of the layer doping are necessary to obtain a high-low junction (also commonly called back surface field or front surface field) or a p-n junction. This can be combined with other methods of surface passivation mentioned above.

Figure 1:
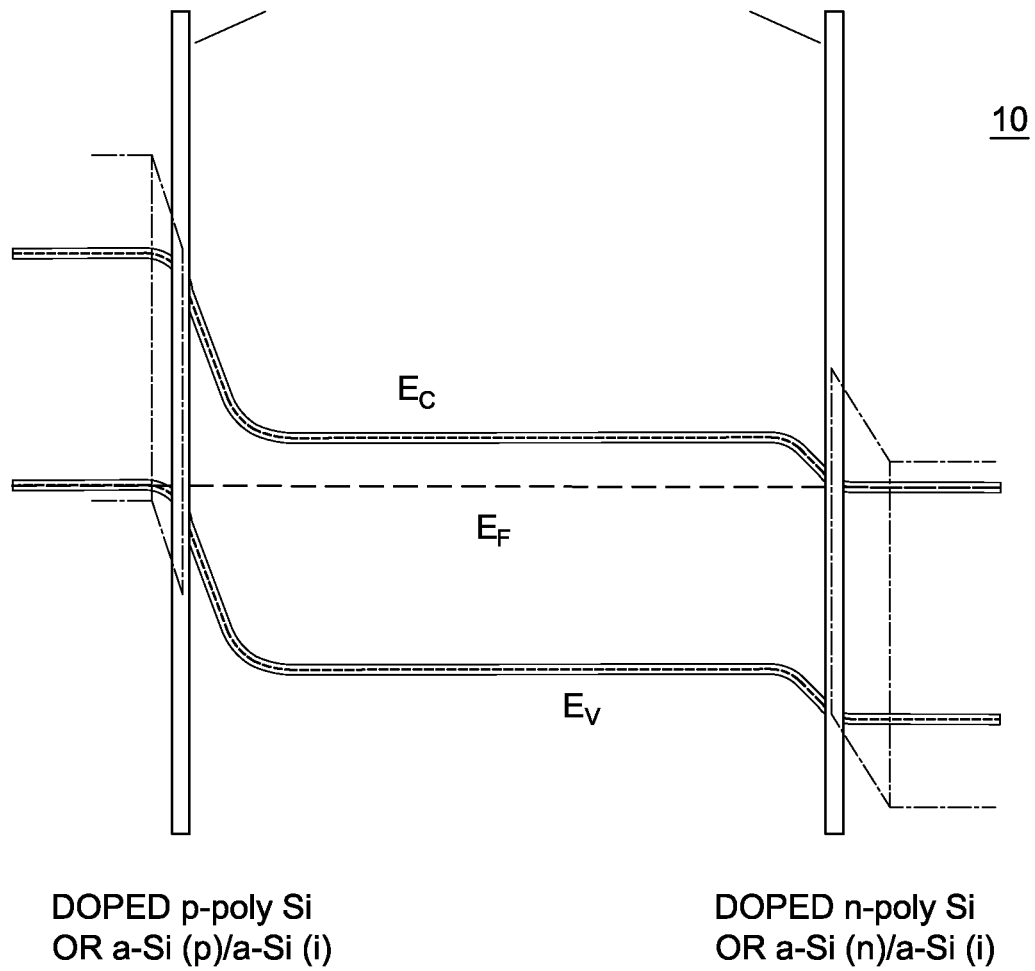
FIG. 1 is an energy band diagram for an n-type crystalline silicon solar cell with doped polysilicon layers and a passivated interface.

Surface passivation can play an important role in achieving highly efficient solar cells. In most of the solar cell structures described below in accordance with the present invention, multiple layers or multifunctional layers can provide excellent surface passivation. This can be achieved via a very steep doping profile and an additional passivation of the interface using a layer with low interface state density and a high band gap resulting in a tunneling barrier for substrate minority carriers to pass. A corresponding energy band diagram is shown in FIG. 1. The solid lines depict the case of an n-type crystalline silicon wafer with a passivated interface and doped polycrystalline silicon passivation layers. The dotted lines represent the case of an n-type crystalline silicon wafer and a double layer structure of intrinsic amorphous silicon followed by doped amorphous silicon layer, sometimes referred to as a heterojunction cell.

These structures provide another benefit for a highly efficient solar cell: the recombination in areas underneath the contacts can be as low as in areas without contacts. The contacts can be shielded by the passivation. As a result, the contact area can be optimized for optical properties, thus minimizing resistive losses, but carrier recombination is decoupled.

Depending on the choice of materials, and doping types and concentrations, the disclosed cell structures may be categorized as front junction or back junctioncells. In a front junction cell the minority carriers (in the case of a p-type wafer these are electrons) are collected on the side of illumination. In a back junction cell the minority carriers are collected at the side opposed to the illumination. Current flow patterns are shown generally in the partial cross-sectional solar cell views of FIGS. 2-5 for p-type and n-type wafers.

Figure 2:
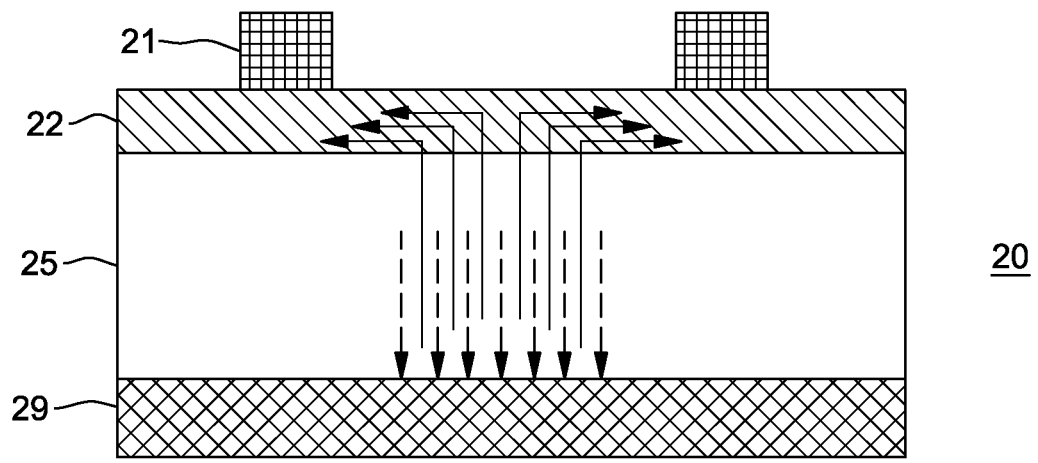
FIG. 2 is a partial cross-sectional view of a solar cell depicting one type of minority and majority carrier flow for a front junction, p-type wafer.

FIG. 2 shows carrier flow for a solar cell 20, in which minority carriers (solid lines) flow to front electrodes 21 from a p-type wafer 25 having a front junction. The electrons need to use lateral flow within the thin n-type emitter 22 to reach the electrodes 21, and the lateral sheet resistance of the emitter 22 increases resistive losses. The majority carriers (dashed lines) can use the shortest geometrical path to the full area back electrode 29.

Figure 3:
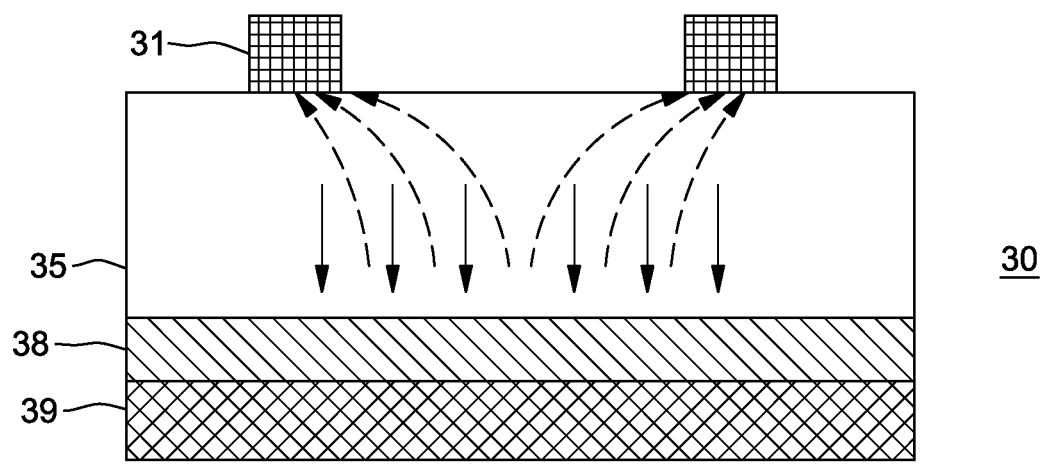
FIG. 3 is a partial cross-sectional view of a solar cell depicting one type of minority and majority carrier flow for a back junction, p-type wafer.

FIG. 3 shows carrier flow for a solar cell 30 from p-type wafer 35 having a back junction. The majority carriers (dashed lines) can use the entire wafer conductivity to reach the front electrodes 31. The minority carriers (solid lines) can use the shortest geometrical path to reach the rear n-type emitter 38, and their transport within the emitter is vertical instead of mainly lateral. This back junction structure reduces the requirements for lateral conductivity of the emitter layer.

Figure 4:
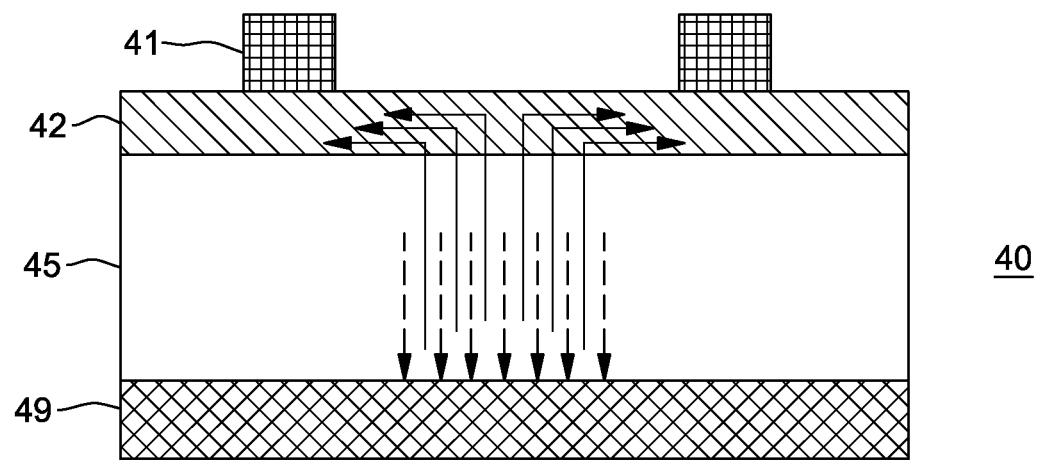
FIG. 4 is a partial cross-sectional view of a solar cell depicting one type of minority and majority carrier flow for a front junction, n-type wafer.

FIG. 4 shows carrier flow for a solar cell 40, in which minority carriers (solid lines) flow to front electrodes 41 from an n-type wafer 45 having a front junction. The holes need to use lateral flow within the thin p-type emitter 42 to reach the electrodes 41, and the lateral conductivity of the emitter determines the resistive losses. The majority carriers (dashed lines) can use the shortest geometrical path to the full area back electrode 49.

Figure 5:
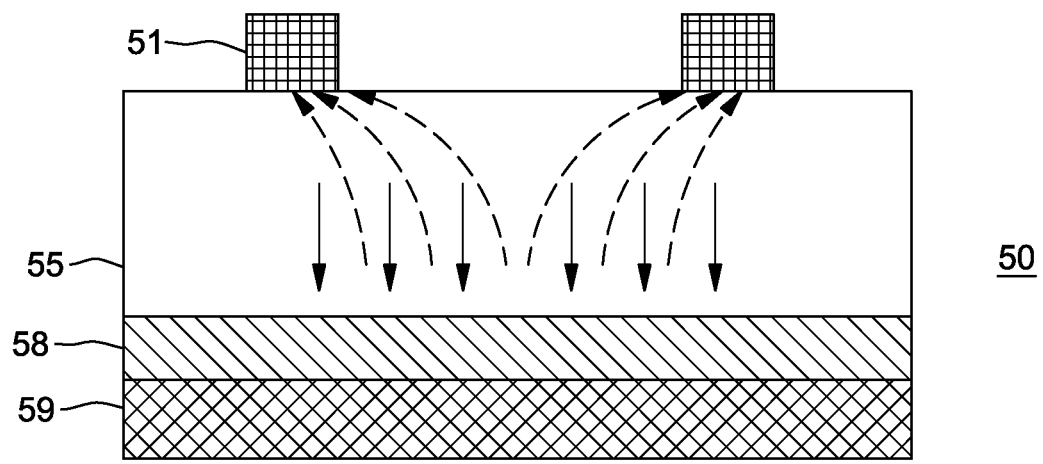
FIG. 5 is a partial cross-sectional view of a solar cell depicting one type of minority and majority carrier flow for a back junction, n-type wafer.

FIG. 5 shows carrier flow for a solar cell 50 from an n-type wafer 55 having a back junction. The majority carriers (dashed lines) can use the entire wafer conductivity to reach the front electrodes 51. The minority carriers (solid lines) can use the shortest geometrical path to reach the rear p-type emitter 58, and their transport within the emitter is vertical instead of mainly lateral. This back junction structure reduces the requirements for lateral conductivity of the emitter layer.

A back junction cell with a full area back contact has the advantage that the minority carriers do not have to flow laterally through the emitter to reach the contacts, their transport within the emitter is mainly vertical. This reduces the losses associated with the lateral transport of the minority carriers within the emitter. Since the full contact area coverage is a requirement to benefit from this property of the structure, a shielded contact is important, e.g., since the metal contacts the layer everywhere ("full area contact coverage"), there is no need for the minority carriers to flow laterally toward the nearest contact, like they do within the emitter in, e.g., FIG. 4.

Figure 6:
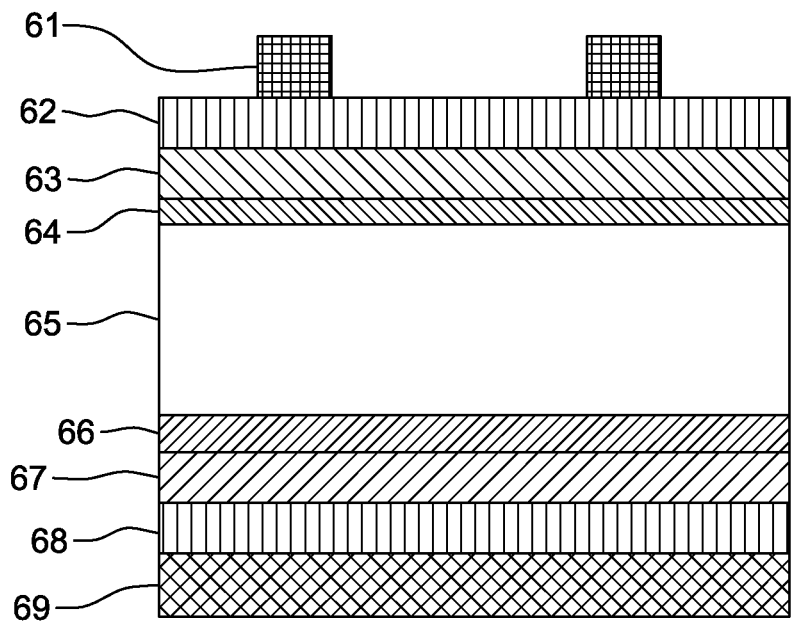
FIG. 6 is a partial cross-sectional view of a solar cell having n-type front, n- or p-type wafer, and p-type back.

Exemplary Cell Structures: n-Type Front, n- or p-Type Wafer, p-Type Back:

FIG. 6 is a partial cross-sectional view of a solar cell 60 having an n-type front, n- or p-type wafer, and p-type back.

The metal electrodes 61 and 69 are positioned on the outer layers 62 and 68, respectively. This has the benefit that the metal does not need to penetrate underlying layers before it contacts the wafer. Furthermore the silicon bulk wafer 65 is shielded from the contact interfaces and hence the contact interface carrier recombination is minimized. This structure has an n-type front surface, which for a p-type wafer 65 collects the minority carriers (electrons) on the front. Therefore a maximum lateral sheet resistance of, for example, 500 Ohm/sq of the combined layers 62, 63 and 64 is required. For an n-type wafer this structure collects the minority carriers (holes) on the back. Therefore the current flow pattern in the solar cell is different and the requirements of lateral conductivity of layer 62 are less critical. Exemplary layers of cell 60 include the following:

61: Front metal electrode.

62: Transparent and conductive film, refractive index in the range of $1.4<n<3$; thickness in the range of 20 nm<thickness<110 nm; sheet resistance of less than 500 Ohm/sq for a p-type wafer (front junction solar cell), specific resistivity in the range of rho<1000 Ohm cm for an n-type wafer (back junction solar cell). Examples include transparent conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

63: Electrically passivating and conductive film, highly n-doped $1e18$ cm$^{-3}<N_D<5e21$ cm$^{-3}$; thickness in the range of 2 nm<thickness<50 nm; specific resistivity in the range of rho<1000 Ohm cm. Examples include:
  n-type amorphous or polycrystalline silicon carbides: phosphorus doped silicon carbide, nitrogen doped silicon carbide;
  n-type amorphous or polycrystalline silicon: phosphorus doped amorphous silicon, nitrogen doped amorphous silicon;
  n-type amorphous or poly-crystalline diamond-like-carbon: nitrogen doped diamond-like carbon.

Any of the above listed examples may include oxygen and hydrogen (n-doped $SiC_xO_yH_z$; n-doped $SiN_xO_yH_z$).

64: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

65: n-type or p-type crystalline silicon wafer; thickness is the range of w<300 um, base resistivity for n-type wafers 0.5 Ohm cm<rho<20 Ohm cm, for p-type wafers 0.1 Ohm cm<rho<100 Ohm cm.

66: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

67: Electrically passivating and conductive film, highly p-doped $1E18-5E21/cm^3$; specific resistivity in the range of rho<1000 Ohm cm. Examples include:
  p-type amorphous or polycrystalline silicon carbides: boron doped silicon carbide, aluminum doped silicon carbide, gallium doped silicon carbide;
  p-type amorphous or polycrystalline silicon: boron doped silicon, aluminum doped silicon, gallium doped silicon;
  p-type amorphous or poly-cystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

68: transparent and conductive film, refractive index in the range of $1.4<n<3$; specific resistivity in the range of rho<1000 Ohm cm. Examples include conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

69: back metal electrode.

Figure 7:
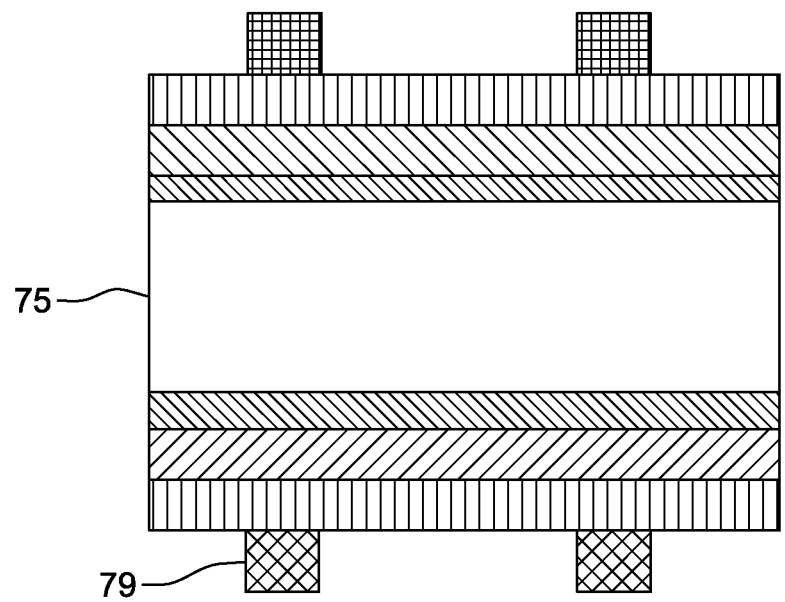
FIG. 7 is a partial cross-sectional view of a solar cell having n-type front, n- or p-type wafer, p-type back, in a bifacial configuration.

FIG. 7 is a partial cross-sectional view of a solar cell 70 having n-type front, n- or p-type wafer, p-type back, in a bifacial configuration. Cell 70 is similar to cell 60 but includes localized electrodes 79 on the back. Because of the localized structure on the back, photons impinging from the rear of the solar cell can be absorbed within the wafer 75 and produce electron-hole pairs. This can increase the power output generated by the solar cell under outdoor operating conditions where albedo can be used at low additional module manufacturing and installation cost.

Figure 8:
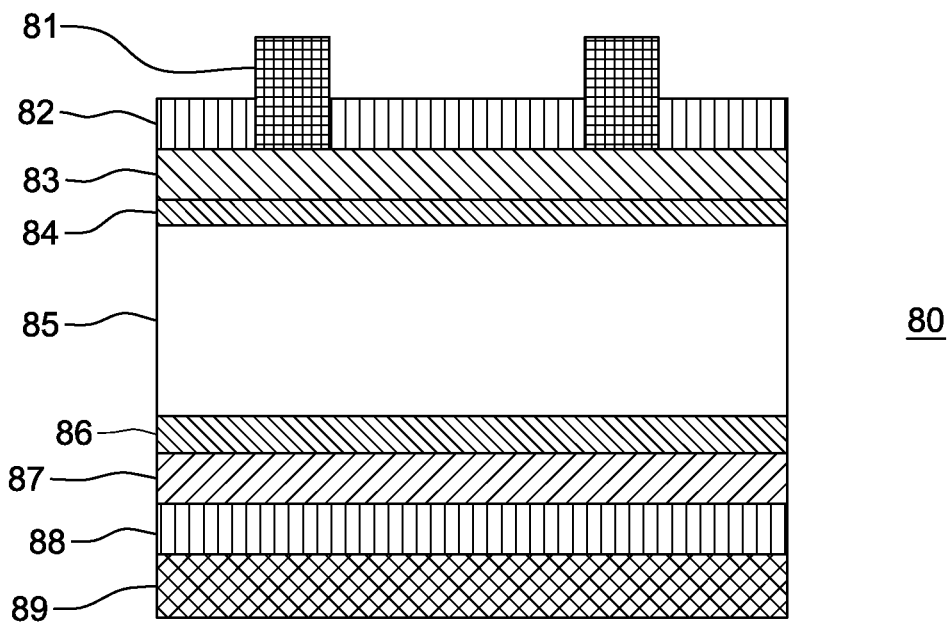
FIG. 8 is a partial cross-sectional view of a solar cell having n-type front, n-type wafer, p-type back, and includes isolating the antireflection coating.

FIG. 8 is a partial cross-sectional view of a solar cell 80 having n-type front, n-type wafer, p-type back, and includes isolating the antireflection coating. This structure is especially beneficial for material combinations where the conductive layers on the front surface of cell structures 60 and 70 have a high absorption. By placing the electrode 81 directly on the contacting layer 83 the conductivity requirements of layer 82 are waived and traditional antireflection coating films (which are insulators) can be used. Exemplary layers of cell 80 include the following:

81: Front metal electrode.

82: Antireflection film, refractive index in the range of $1.4<n<3$; thickness in the range of 20 nm<thickness<110 nm. Examples include silicon nitride, silicon carbide, silicon oxide, transparent conductive oxides.

83: Electrically passivating and conductive film; thickness<110 nm; highly n-doped $1e18$ cm$^{-3}<N_D<5e21$ cm$^{-3}$, specific resistivity in the range of rho<1000 Ohm cm. Examples include:
  n-type amorphous or polycrystalline silicon carbides: phosphorus doped silicon carbide, nitrogen doped silicon carbide;
  n-type amorphous or polycrystalline silicon: phosphorus doped amorphous silicon, nitrogen doped amorphous silicon;

n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

84: Electrically passivating interface layer; thickness thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

85: n-type crystalline silicon wafer; thickness is in the range of w<300 um, base resistivity for n-type wafers 0.5 Ohm cm<rho<20 Ohm cm.

86: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

87: Electrically passivating and conductive film, highly doped p-doped $1e18$ $cm^{-3}<N_A<5e21$ $cm^{-3}$; specific resistivity in the range of rho<1000 Ohm cm. Examples include:
p-type amorphous or polycrystalline silicon carbides: boron doped silicon carbide, aluminum doped silicon carbide, gallium doped silicon carbide;
p-type amorphous or polycrystalline silicon: boron doped silicon, aluminum doped silicon, gallium doped silicon;
p-type amorphous or poly-cystalline diamond-like-carbon: boron doped diamond-like carbon, aluminum doped diamond-like carbon.

Any of the above examples may contain oxygen and hydrogen (p-doped $SiC_xO_yH_z$; p-doped $SiN_xO_yH_z$).

88: Transparent and conductive film, refractive index in the range of 1.4<n<3; specific resistivity in the range of rho<1000 Ohm cm. Examples include transparent conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

89: back metal electrode.

Figure 9:
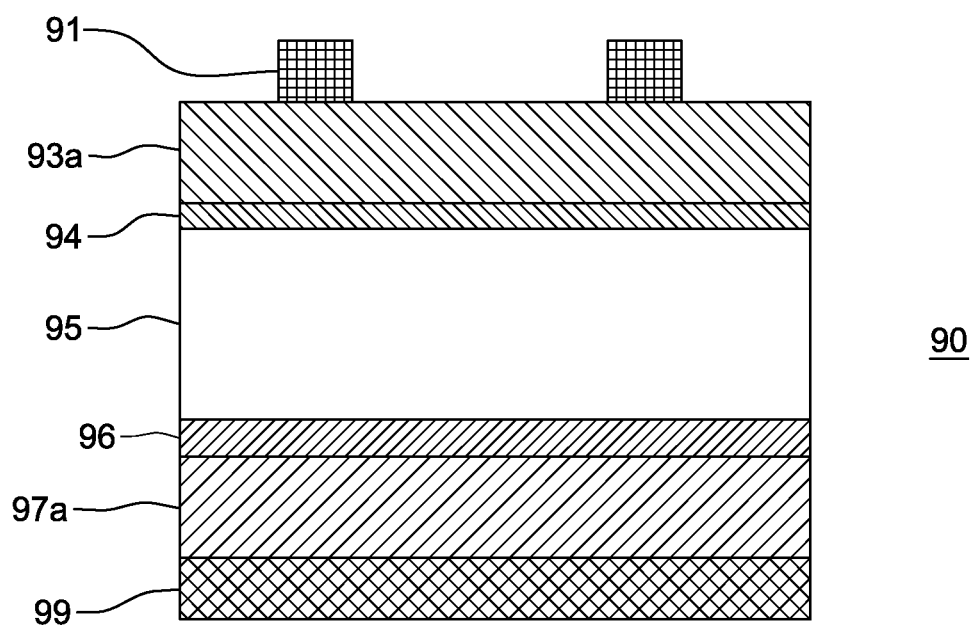
FIG. 9 is a partial cross-sectional view of a solar cell having n-type front, n-type wafer, p-type back, and includes a multifunctional transparent, conductive, highly doped silicon compound layer.

FIG. 9 is a partial cross-sectional view of a solar cell 90 having n-type front, n-type wafer, p-type back, and including a multifunctional transparent, conductive, highly doped silicon compound layer. This aspect of the invention is an improvement to the other disclosures above, because the functions of layers 62 and 63 of, e.g., solar cell 60 of FIG. 6 (and any other similar layers in any other embodiments disclosed herein) are combined into a multifunctional layer 93a depicted in FIG. 9. This layer can be electrically passivating, transparent, and sufficiently conductive for a vertical carrier flow to the electrodes (back junction solar cell), provides the junction with the wafer 95 and/or reduces the reflectance of the incoming light (e.g., antireflection coating). On the rear, layer 97a can combine the functions of layers 67 and 68 of, e.g., solar cell 60 of FIG. 6 (and any other similar layers in any other embodiments disclosed herein). Layer 97a provides the junction with the wafer 95, has a refractive index which results in a high reflectivity for photons of more than 900 nm wavelength and is sufficiently conductive for vertical carrier flow from the wafer 95 to the metal electrode 99. Exemplary layers of cell 90 include the following:

91: Front metal electrode.

93a: Electrically passivating, transparent and conductive film, refractive index in the range of 1.4<n<3; thickness in the range of 20 nm<thickness<110 nm; specific resistivity in the range of rho<1000 Ohm cm for an n-type wafer; highly doped n-doped $1e18$ $cm^{-3}<N_D<5e21$ $cm^{-3}$. Examples include:
n-type amorphous or polycrystalline silicon carbides: phosphorus doped silicon carbide, nitrogen doped silicon carbide;
n-type amorphous or polycrystalline silicon: phosphorus doped amorphous silicon, nitrogen doped amorphous silicon;
n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

94: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

95: n-type or p-type crystalline silicon wafer; thickness is in the range of w<300 um, base resistivity for n-type wafers 0.5 Ohm cm<rho<20 Ohm cm, for p-type wafers 0.1 Ohm cm<rho<100 Ohm cm.

96: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

97a: Electrically passivating and transparent and conductive film; specific resistivity in the range of rho<1000 Ohm cm. Examples include:
p-type amorphous or polycrystalline silicon carbides: boron doped silicon carbide, aluminum doped silicon carbide, gallium doped silicon carbide;
p-type amorphous or polycrystalline silicon: boron doped silicon, aluminum doped silicon, gallium doped silicon;
p-type amorphous or poly-crystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

99: back metal electrode.

Figure 10:
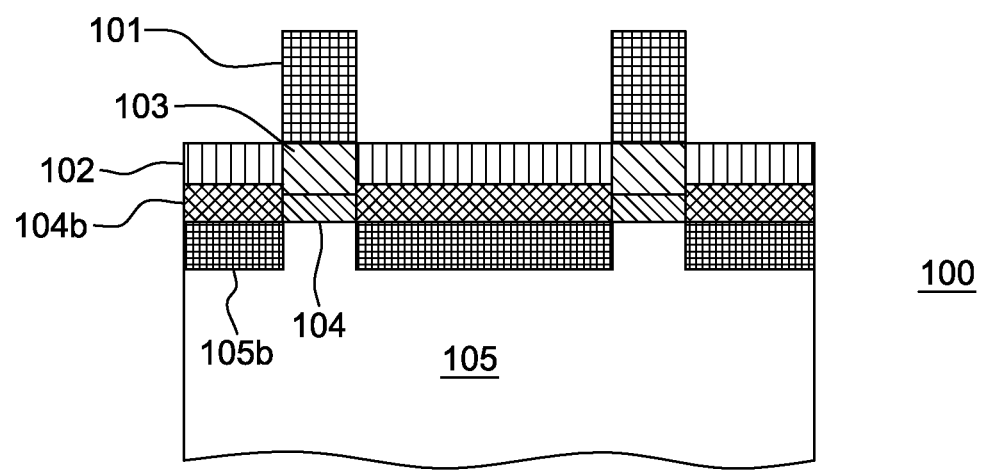
FIG. 10 is a partial cross-sectional view of a solar cell having n- or p-type wafer, n-type front, including certain front layer improvements, and p-type back.

FIG. 10 is a partial cross-sectional view of a solar cell 100 having n- or p-type wafer, n-type front, including certain front layer improvements, and p-type back. The rear surface structures (omitted for convenience) can be implemented according to any of the other structures described herein.

This structure is especially beneficial for material combinations where the layers x3 and x4 on, e.g., the front surface of structures disclosed above, have unacceptably high absorption. (The x3 and x4 notation is further explained below and represents any of the above layers with reference numerals ending in 3, 3a, 4, 4a, respectively). In cell 100, by placing layers 103 and 104 under the contacts only, their optical properties (refractive index, absorption) are not important for cell efficiency. Resistance losses only occur through vertical carrier flow to the contacts 101. Layers 102, 104b and 105b also do not have to shield the contact, so they can be optimized for transmissivity and surface passivation. If they do provide lateral conductivity, this will facilitate the current flow towards the contacts and the contact structures can be placed further apart from each other. This reduces optical shading losses. This structure works best with a back junction since the lateral conductivity requirements of layer 102, 104b and 105b are waived. Exemplary layers of cell 100 include the following:

101: Front metal electrode.

102: Antireflection film, refractive index in the range of $1.4<n<3$; thickness<150 nm. Examples include silicon nitride, silicon carbide, silicon oxide, titanium oxide, transparent conductive oxides.

103: Electrically passivating conductive film, e.g., thickness<50 nm; e.g., specific resistivity in the range of rho<1000 Ohm cm. Examples include:

n-type amorphous or polycrystalline silicon carbides: phosphorus doped silicon carbide, nitrogen doped silicon carbide;

n-type amorphous or polycrystalline silicon: phosphorus doped amorphous silicon, nitrogen doped amorphous silicon;

n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

104: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

104b: Electrically passivating interface layer; thickness<110 nm. Examples include silicon oxide, silicon nitride, intrinsic amorphous silicon, intrinsic polycrystalline silicon, aluminum oxide, aluminum nitride, phosphorus nitride, titanium nitride, silicon carbide or stacks of two or more of these materials.

105: n-type or p-type crystalline silicon wafer; thickness is in the range of w<300 um, base resistivity for n-type wafers 0.5 Ohm cm<rho<20 Ohm cm, for p-type wafers 0.1 Ohm cm<rho<100 Ohm cm.

105b: phosphorus diffused silicon layer (optional), sheet resistance>70 Ohm/sq.

The structures above are not mutually exclusive, and any feature of one structure, can apply to any other structure herein, in accordance with the present invention.

Figure 11:
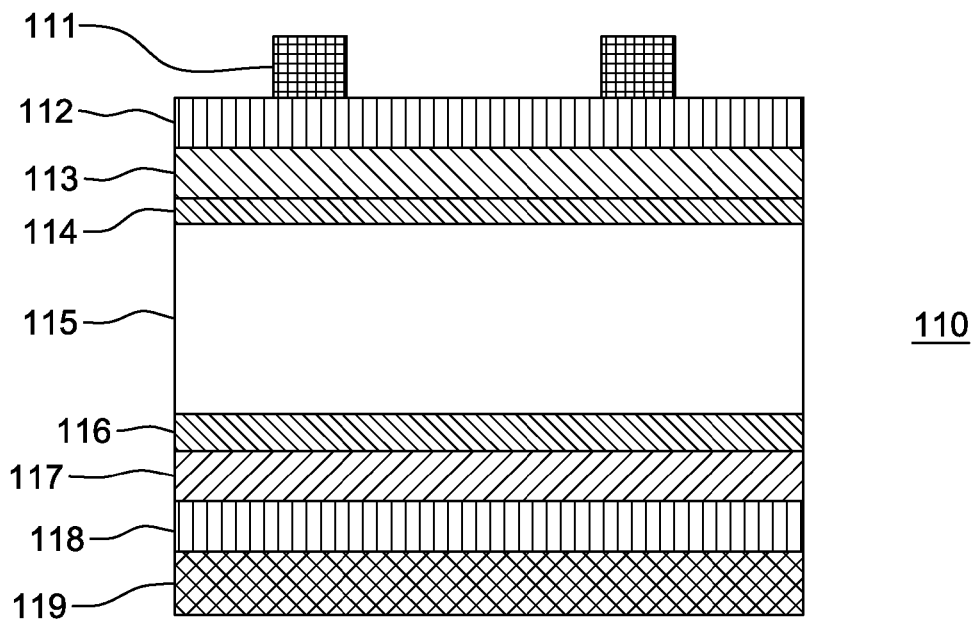
FIG. 11 is a partial cross-sectional view of a solar cell having a p-type front, n- or p-type wafer, and n-type back.

Exemplary Cell Structures: p-Type Front, n- or p-Type Wafer, n-Type Back:

FIG. 11 is a partial cross-sectional view of a solar cell 110 having a p-type front, n- or p-type wafer, and n-type back.

In this cell, the metal electrodes 111 and 119 are placed on the outer layers 112 and 118, respectively. This provides the benefit that the metal does not need to penetrate underlying layers before it contacts the wafer. Furthermore the silicon bulk wafer 115 is shielded from the contact interfaces and hence the contact interface carrier recombination is minimized. This structure has a p-type front surface, for an n-type wafer this structure collects the minority carriers (holes) on the front. Therefore a maximum lateral sheet resistance of 500 Ohm/sq of the combined layers 112, 113 and 114 is allowed. For a p-type wafer this structure collects the minority carriers (electrons) on the back. Therefore the current flow pattern in the solar cell is different and the requirements on the lateral conductivity of layer 112 are less critical. Exemplary layers of cell 110 include the following:

111: Front metal electrodes.

112: Transparent and conductive film, refractive index in the range of $1.4<n<3$; thickness<110 nm; sheet resistance of less than 500 Ohm/sq for an n-type wafer, specific resistivity in the range of rho<1000 Ohm cm for a p-type wafer. Examples include transparent conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

113: Electrically passivating and conductive film, highly doped p-doped $1e18\ cm^{-3}<N_A<5e21\ cm^{-3}$; specific resistivity in the range of rho<1000 Ohm cm. Examples include:

p-type amorphous or polycrystalline silicon carbides: boron doped silicon carbide, aluminum doped silicon carbide, gallium doped silicon carbide;

p-type amorphous or polycrystalline silicon: boron doped silicon, aluminum doped silicon, gallium doped silicon;

p-type amorphous or poly-crystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

114: Electrically passivating interface layer; <10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

115: n-type or p-type crystalline silicon wafer; thickness is in the range of w<300 um, base resistivity for n-type wafers 0.5 Ohm cm<rho<20 Ohm cm, for p-type wafers 0.1 Ohm cm<rho<100 Ohm cm.

116: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

117: Electrically passivating, transparent and conductive film, highly doped n-doped $1e18\ cm^{-3}<N_D<5e21\ cm^3$; e.g., thickness in the range of 2 nm<thickness<50 nm or more; specific resistivity in the range of rho<1000 Ohm cm. Examples include:

n-type amorphous or polycrystalline silicon carbides: phosphorus doped silicon carbide, nitrogen doped silicon carbide;

n-type amorphous or polycrystalline silicon: phosphorus doped amorphous silicon, nitrogen doped amorphous silicon;

n-type amorphous or poly-crystalline diamond-like-carbon: nitrogen doped diamond-like carbon.

Any of the above examples may contain oxygen and hydrogen (n-doped $SiC_xO_yH_z$; n-doped $SiN_xO_yH_z$).

118: Transparent and conductive film, refractive index in the range of $1.4<n<3$; specific resistivity in the range of rho<1000 Ohm cm. Examples include transparent conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

119: back metal electrode.

Figure 12:
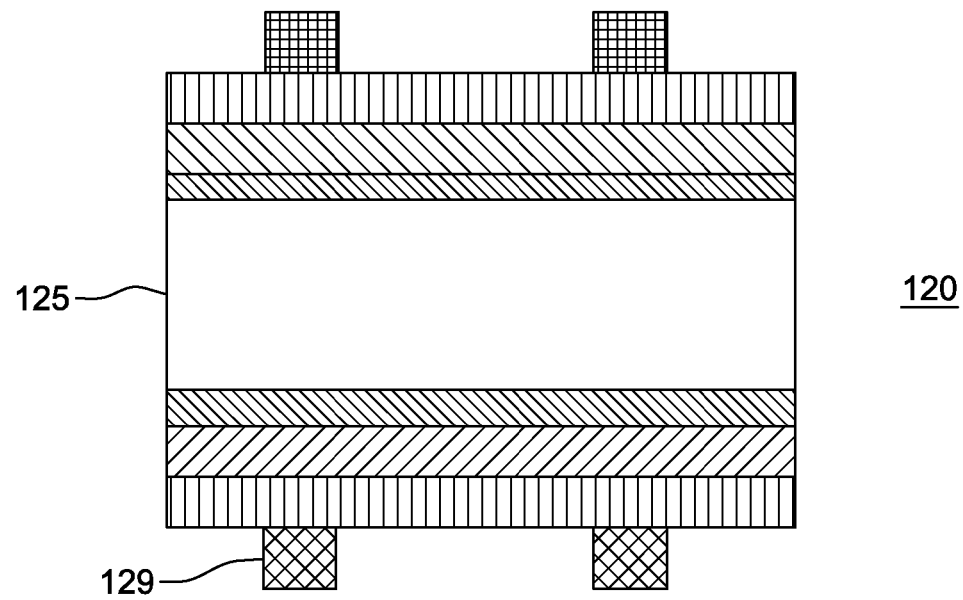
FIG. 12 is a partial cross-sectional view of a solar cell having p-type front, n- or p-type wafer, n-type back, in a bifacial configuration.

FIG. 12 is a partial cross-sectional view of a solar cell 120 having p-type front, n- or p-type wafer, n-type back, in a bifacial configuration. Cell 120 is similar to cell 110 but includes localized electrodes 129 on the back. Because of the localized structure on the back, photons impinging from the rear of the solar cell can be absorbed within the wafer 125 and produce electron-hole pairs. This can improve the efficiency of the solar cell under outdoor operating conditions where albedo can be used at low additional module manufacturing and installation cost.

Figure 13:
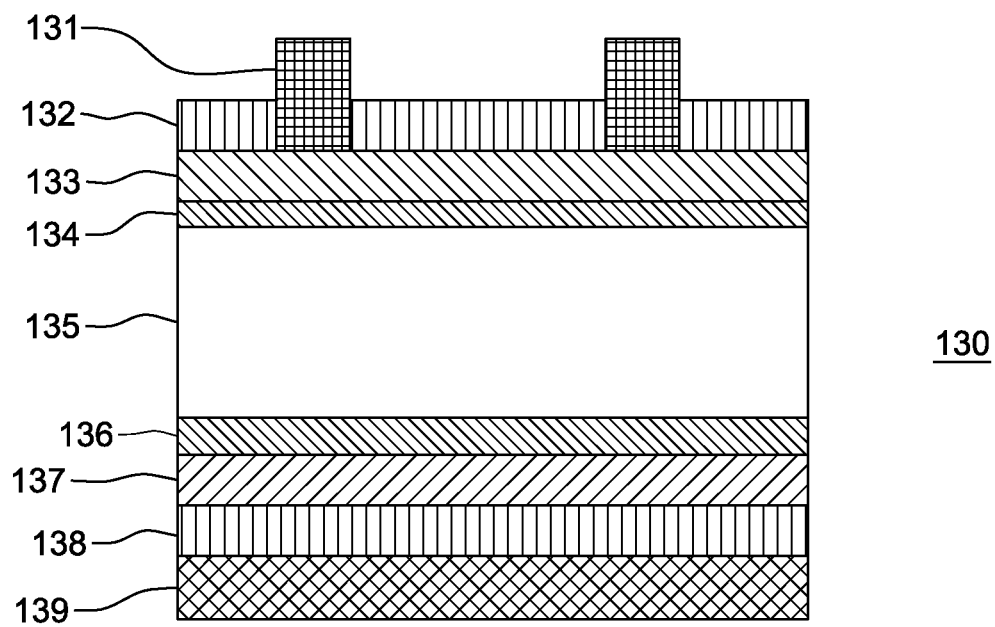
FIG. 13 is a partial cross-sectional view of a solar cell having p-type front, p-type wafer, n-type back, and includes isolating the antireflection coating.

FIG. 13 is a partial cross-sectional view of a solar cell 130 having p-type front, p-type wafer, n-type back, and includes isolating the antireflection coating. This structure is especially beneficial for material combinations where the conductive layers on the front surface of cell structures 110 and 120 have a high absorption. By placing the electrodes 131 directly on the contacting layer 133 the conductivity requirements of layer 132 are waived and traditional antireflection coating films (which are insulators) can be used. This structure works best with a back junction since the lateral conductivity requirements of layer 133 and 134 are not critical. Exemplary layers of cell 130 include the following:

131: Front metal electrodes.

132: Antireflection film, refractive index in the range of $1.4<n<3$; $<150$ nm. Examples include silicon nitride, silicon carbide, silicon oxide, aluminum oxide, titanium oxide, transparent conductive oxides.

133: Electrically passivating, transparent and conductive film; thickness$<110$ nm; specific resistivity in the range of rho$<1000$ Ohm cm. Examples include:
  p-type amorphous or polycrystalline silicon carbides: boron doped silicon carbide, aluminum doped silicon carbide, gallium doped silicon carbide;
  p-type amorphous or polycrystalline silicon: boron doped silicon, aluminum doped silicon, gallium doped silicon;
  p-type amorphous or poly-cystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

134: Electrically passivating interface layer; thickness$<10$ nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

135: p-type crystalline silicon wafer; thickness is the range of $w<300$ um, base resistivity for p-type wafers 0.1 Ohm cm$<$rho$<100$ Ohm cm.

136: Electrically passivating interface layer; thickness$<10$ nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

137: Electrically passivating, transparent and conductive film, highly doped n-doped $1e18$ cm$^{-3}<N_D<5e21$ cm$^{-3}$; specific resistivity in the range of rho$<1000$ Ohm cm. Examples include:
  n-type amorphous or polycrystalline silicon carbides: phosphorus doped silicon carbide, nitrogen doped silicon carbide;
  n-type amorphous or polycrystalline silicon: phosphorus doped amorphous silicon, nitrogen doped amorphous silicon;
  n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

138: transparent and conductive film, refractive index in the range of $1.4<n<3$; specific resistivity in the range of rho$<1000$ Ohm cm. Examples include transparent conductive oxides like indium tin oxide, aluminum doped zinc oxide, fluorine doped tin oxide, tantalum oxide, antimony tin oxide, germanium oxide, zirconium oxide, titanium oxide, gallium oxide, cadmium antimony oxide.

139: back metal electrode.

Figure 14:
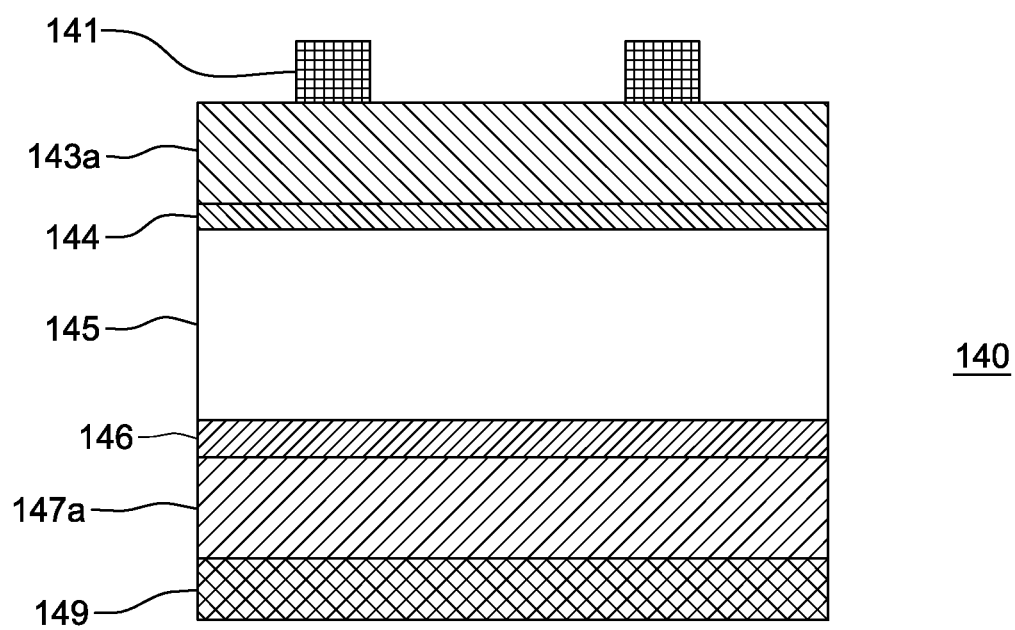
FIG. 14 is a partial cross-sectional view of a solar cell having p-type front, p-type wafer, n-type back, and including a multifunctional transparent, conductive, highly doped silicon compound layer.

FIG. 14 is a partial cross-sectional view of a solar cell 140 having p-type front, p-type wafer, n-type back, and including a multifunctional transparent, conductive, highly doped silicon compound layer. This aspect of the invention is an improvement to the other disclosures above, because the functions of layers 112 and 113 of, e.g., solar cell 110 of FIG. 11 (and any other similar layers in any other embodiments disclosed herein) are combined into a multifunctional layer 143a depicted in FIG. 14. This layer can be electrically passivating, transparent, and sufficiently conductive for a vertical carrier flow to the electrodes (back junction solar cell), provides the junction with the wafer 145 and/or reduces the reflectance of the incoming light (e.g., antireflection coating). On the rear, layer 147a can combine the functions of layers 117 and 118 of, e.g., solar cell 110 of FIG. 11 (and any other similar layers in any other embodiments disclosed herein). Layer 147a provides the junction with the wafer 145, has a refractive index which results in a high reflectivity for photons of more than 900 nm wavelength and is sufficiently conductive for vertical carrier flow from the wafer 145 to the metal electrode 149. Exemplary layers of cell 140 include the following:

141: Front metal electrode.

143a: Electrically passivating and transparent and conductive film, refractive index in the range of $1.4<n<3$; thickness$<150$ nm; specific resistivity in the range of rho$<1000$ Ohm cm. Examples include:
  p-type amorphous or polycrystalline silicon carbides: boron doped silicon carbide, aluminum doped silicon carbide, gallium doped silicon carbide;
  p-type amorphous or polycrystalline silicon: boron doped silicon, aluminum doped silicon, gallium doped silicon;
  p-type amorphous or poly-cystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

144: Electrically passivating interface layer; thickness$<10$ nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

145: n-type or p-type crystalline silicon wafer; thickness is in the range of $w<300$ um, base resistivity for n-type wafers 0.5 Ohm cm$<$rho$<20$ Ohm cm, for p-type wafers 0.1 Ohm cm$<$rho$<100$ Ohm cm.

146: Electrically passivating interface layer; thickness$<10$ nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

147a: Electrically passivating and transparent and conductive film; specific resistivity in the range of rho$<1000$ Ohm cm for a highly doped n-doped $1E18$ cm$^{-3}<N_D<5E21$ cm$^3$. Examples include:
  n-type amorphous or polycrystalline silicon carbides: phosphorus doped silicon carbide, nitrogen doped silicon carbide;

n-type amorphous or polycrystalline silicon: phosphorus doped amorphous silicon, nitrogen doped amorphous silicon;

n-type amorphous or poly-crystalline diamond-like-carbon: nitrogen doped diamond-like carbon.

Any of the above examples may include oxygen and hydrogen (n-doped $SiC_xO_yH_z$; n-doped $SiN_xO_yH_z$).

149: back metal.

Figure 15:
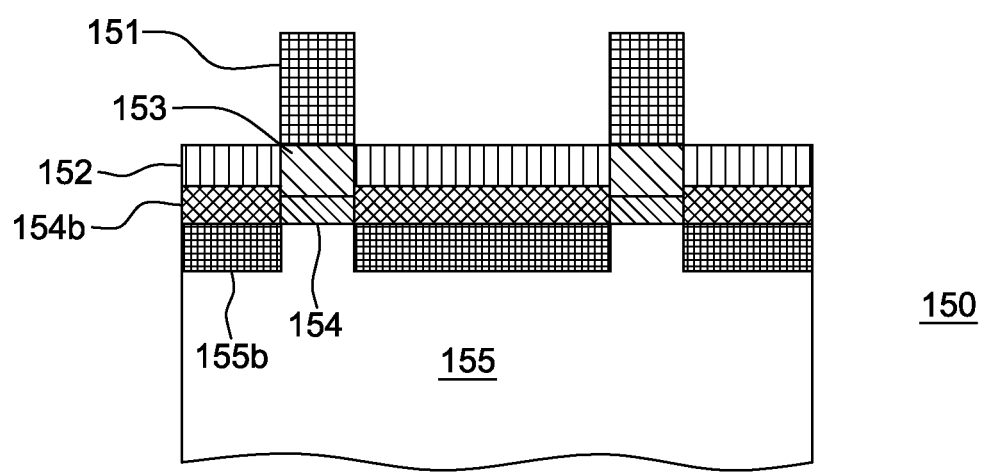
FIG. 15 is a partial cross-sectional view of a solar cell having n- or p-type wafer, p-type front, including certain front layer improvements, and n-type back.

FIG. 15 is a partial cross-sectional view of a solar cell 150 having n- or p-type wafer, p-type front, including certain front layer improvements, and n-type back. The rear surface structures (omitted for convenience) can be implemented according to any of the other structures described herein.

This structure is especially beneficial for material combinations where the layers xx3 and xx4 on, e.g., the front surface of structures disclosed above, have unacceptably high absorption. In cell 150, by placing layers 153 and 154 under the contacts only, their optical properties (refractive index, absorption) are not important for cell efficiency. Resistance losses only occur through vertical carrier flow to the contacts 151. Layers 152, 154b and 155b also do not have to shield the contact, so they can be optimized for transmissivity and surface passivation. If they do provide lateral conductivity, this will facilitate the current flow towards the contacts and the contact structures can be placed further apart from each other. This reduces optical shading losses. This structure works best with a back junction since the lateral conductivity requirements of layer 152, 154b and 155b are waived. Exemplary layers of cell 150 include the following:

151: Front metal electrode.

152: Antireflection film, refractive index in the range of 1.4<n<3; thickness thickness<110 nm. Examples include silicon nitride, silicon carbide, silicon oxide, titanium oxide.

153: Electrically passivating conductive film, thickness<110 nm; specific resistivity in the range of rho<1000 Ohm cm. Examples include:
  p-type amorphous or polycrystalline silicon carbides: boron doped silicon carbide, aluminum doped silicon carbide, gallium doped silicon carbide;
  p-type amorphous or polycrystalline silicon: boron doped silicon, aluminum doped silicon, gallium doped silicon;
  p-type amorphous or poly-cystalline diamond-like-carbon: boron doped diamond-like carbon, aluminum doped diamond-like carbon.

Any of the above examples may include oxygen and hydrogen (p-doped $SiC_xO_yH_z$; p-doped $SiN_xO_yH_z$).

154: Electrically passivating interface layer; thickness<10 nm; no conductivity requirements because of small thickness; no absorption restrictions due to small thickness. Examples include silicon oxide, silicon nitride, intrinsic amorphous silicon, intrinsic polycrystalline silicon, aluminum oxide, aluminum nitride, phosphorus nitride, titanium nitride.

154b: Electrically passivating interface layer; thickness<10 nm. Examples include silicon oxide, silicon nitride, intrinsic amorphous silicon, intrinsic polycrystalline silicon, aluminum oxide, aluminum nitride, phosphorus nitride, titanium nitride, silicon carbide.

155: n-type or p-type crystalline silicon wafer; thickness is in the range of w<300 um, base resistivity for n-type wafers 0.5 Ohm cm<rho<20 Ohm cm, for p-type wafers 0.1 Ohm cm<rho<100 Ohm cm.

155b: phosphorus diffused silicon layer (optional), sheet resistance>70 Ohm/sq.

The structures above are not mutually exclusive, and any feature of one structure, can apply to any other structure herein, in accordance with the present invention.

Figure 16:
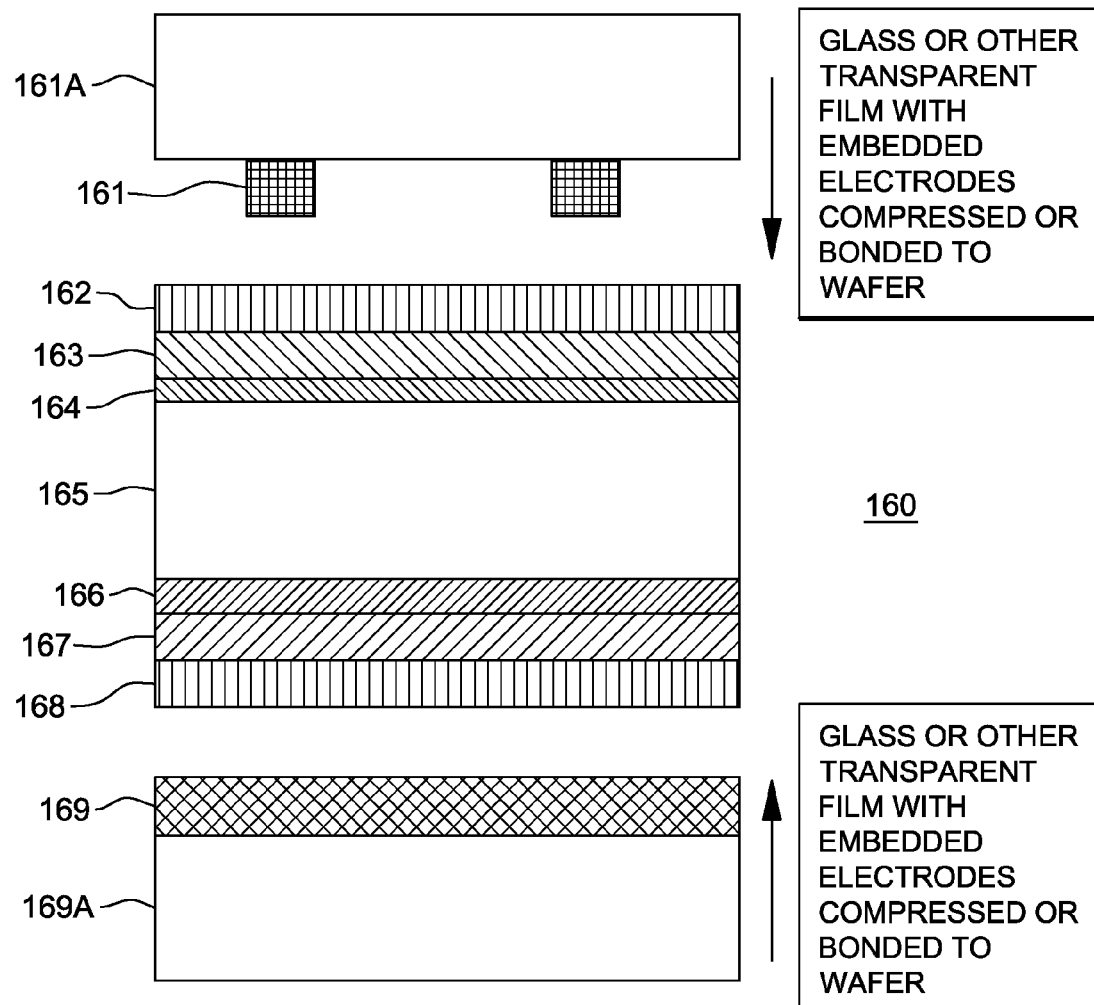
FIG. 16 is a partial cross-sectional view of a solar cell having glass or other transparent film with embedded electrodes, compressed or bonded to the cell.

Exemplary Cell Structures—Alternative Electrode Configurations:

FIG. 16 is a partial cross-sectional view of a solar cell 160 having glass or other transparent film with embedded electrodes, compressed or bonded to the cell. This alternative applies to any of the structures above, and can include an n- or p-type front, n- or p-type wafer, and p- or n-type back. As an alternative to the metal electrodes being deposited directly on the cell, the metal electrodes 161 and 169 are embedded in a glass or other laminating films 161a and 169a. When the glass or laminating film is compressed or laminated under pressure, the embedded electrodes make contact on top of the outer layers 162 and 168, respectively. This has the benefit that the metal does not need to be deposited directly onto the cell itself, thereby eliminating a typical source of film stress which can cause cell bowing. This is particularly useful when dealing with very large area wafers, such as thin-film silicon sheets and/or very thin wafers. In many of the embodiments above, the metal electrodes do no need to penetrate underlying layers before they contact the cell. Moreover, various conducing materials can be used to enhance the electrical conductivity between the metal electrodes 161 and 169 and the surface of the outer layers 162 and 168. These conducting materials could include but are not limited to anisotropic conducting films (ACF), conductive epoxies, or spring-like contact probes. Exemplary layers of cell 160 include the following (which can be formed of any of the materials above, omitted here for simplicity):

161a: Glass plate or transparent film carrying embedded metal electrodes.

161: Front metal electrode.

162: Transparent and conductive film.

163: Electrically passivating and conductive film.

164: Electrically passivating interface layer.

165: n-type or p-type crystalline silicon wafer; thickness is the range of w<300 um.

166: Electrically passivating interface layer.

167: Electrically passivating and conductive film.

168: Transparent and conductive film.

169: Back metal electrode.

169a: Glass plate or transparent film carrying embedded metal electrode.

Figure 17:
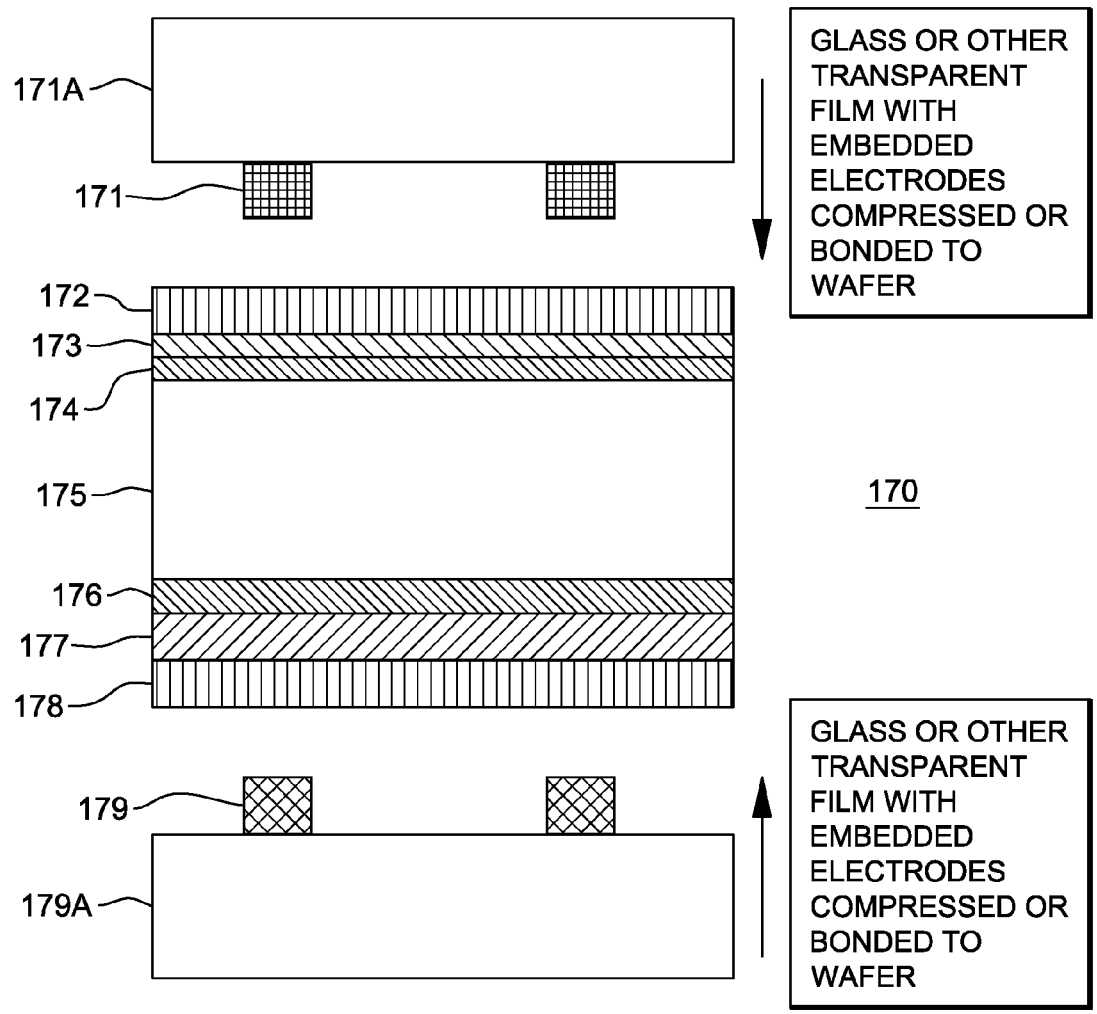
FIG. 17 is a partial cross-sectional view of a solar cell having glass or other transparent film with embedded electrodes, compressed or bonded to the cell, including a localized electrode on the back.

FIG. 17 is a partial cross-sectional view of a solar cell 170 having glass or other transparent film with embedded electrodes, compressed or bonded to the cell, having localized electrodes 179 on the back. Because of the localized electrode structure on the back, photons impinging the rear of the solar cell can be absorbed within the wafer 175 and produce electron-hole pairs in this bifacial configuration. This can improve the efficiency of the solar cell under outdoor operating conditions where albedo can be used at low additional module manufacturing and installation cost.

This alternative applies to any of the structures above, and can include an n- or p-type front, n- or p-type wafer, and p- or n-type back. As an alternative to the metal electrodes being deposited directly on the cell, the metal electrodes 171 and 179 are embedded in a glass or other laminating films 171a and 179a. When the glass or laminating film is compressed or laminated under pressure, the embedded electrodes make contact on top of the outer layers 172 and 178, respectively. This has the benefit that the metal does not need to be deposited directly onto the cell itself, thereby eliminating a typical source of film stress which can cause cell bowing. This is particularly useful when dealing with very large area wafers, such as thin-film silicon sheets and/or very thin wafers. In many of the embodiments above, the metal electrodes do no need to penetrate underlying layers before they contact the cell. Moreover, various conducing materials can be used to enhance the electrical conductivity between the metal electrodes 171 and 179 and the surface of the outer layers 172 and 178. These conducting materials could include but are not limited to anisotropic conducting films (ACF), conductive epoxies, or spring-like contact probes. Exemplary layers of cell 170 include the following (which can be formed of any of the materials above, omitted here for simplicity):

- 171*a*: Glass plate or transparent film carrying embedded metal electrodes.
- 171: Front metal electrode.
- 172: Transparent and conductive film.
- 173: Electrically passivating and conductive film.
- 174: Electrically passivating interface layer.
- 175: n-type or p-type crystalline silicon wafer; thickness is the range of w<300 um.
- 176: Electrically passivating interface layer.
- 177: Electrically passivating and conductive film.
- 178: Transparent and conductive film.
- 179: Back metal electrode.
- 179*a*: Glass plate or transparent film carrying embedded metal electrode.

The structures above are not mutually exclusive, and any feature of one structure, can apply to any other structure herein, in accordance with the present invention.

Fabrication Methods:

The following process flows are examples of methods to produce the structures disclosed above; but other methods are possible without departing from the scope of the present invention. Initially, the incoming wafer is obtained free of surface damage, may be textured or otherwise modified in its geometrical shape, and has a clean surface. As discussed above, and for the sake of simplicity, the geometrical surface shape of layer surfaces (e.g., surface texture such as pyramids, or other surface texture, can be formed on layer surfaces) is not portrayed in these drawings, however, it is understood that the geometrical shape and/or surfaces may be textured in any shape beneficial for improved solar cell efficiency, and falls within the scope of the invention.

Subsequent processing steps can be as follows (the use of the designation such as "xx4" or any other similarly designated number connotes the analogous layers of any of the above structures of FIGS. 1-18 ending in "4" or "4*a*" such as 4, 14, 134, 4*a*, 14*a*, 134*a*, etc):

- Deposition or growth of the interface passivation layers xx4 and xx6;
- Deposition of layers xx3 and xx7;
- Thermal treatment;
- Optional deposition of layers xx2 and xx8 (including possibly a low reflective index layer for a good internal mirror on the back—refractive index basically smaller than 3.0, smaller than 2.6, smaller than 2.0, smaller than 1.5); and
- Metallization.

In any of the structures above, the layers (e.g., xx2, xx3, xx4, xx6, xx7 and xx8) are electrically conductive, i.e., the metallization can be placed directly on the outer layer. (In typical high-efficiency solar cells this is not the case since surface passivation is usually done by materials that are also electrical insulators.) This allows for innovative metallization schemes, for example, the solar cells can be laminated into a module which has the electrodes embedded in the glass or in the lamination sheets. Furthermore, conductive sheets can be applied to mechanically strengthen the cells. Another way of metallization could involve the deposition of thin lines of metals. Due to the conductivity of the surfaces, the requirements on the metal paste are reduced because they directly contact the outer layers and do not need to etch through an insulating layer in order to contact the solar cell. Another example would be the direct evaporation or sputtering of metal onto the conductive surfaces.

Most layers within the solar cell structures described above can be deposited or grown with methods such as PECVD, APCVD, LPCVD, PVD, plating etc. For some layers and combinations of layers, innovative methods of producing the layers and structures may be useful. For example, thermal oxidation or plasma deposition or plasma assisted oxidation can be used to form the interface passivating layer(s).

For example, in order to achieve a highly efficient solar cell with a cost-effective production method, it is advantageous to deposit films of different characteristics only on one side. While this can be difficult to do, (e.g., for a standard tube furnace deposition of e.g. LPCVD deposited polycrystalline silicon), a PECVD deposition can be done on one side of a wafer without deposition on the other side. PECVD tools are available on an industrial scale but may only operate in temperature regimes where amorphous or microcrystalline silicon layers can be deposited. In the described cell structures, amorphous silicon layers can be turned into polycrystalline silicon layers by thermal treatment. This also holds true for doped amorphous silicon layers or compounds of amorphous silicon carbides, etc. This crystallization negatively affects the passivation quality of the silicon/amorphous silicon interface layer (if it exists in the cell structure). However, layers xx4 and xx6 buffer the wafer surface from the crystallized polysilicon layer. Therefore, the interface is still passivated after the thermal treatment and the layer systems are stable at the thermal-treatment temperature.

In accordance with the present invention, during the crystallization process many properties of the layer change: Donors or acceptors get activated, the optical transmission increases, hydrogen effuses from the layer. The thermal treatment may activate doping atoms in the compound and result in diffusion of dopant atoms into a substrate wafer to provide a high-low junction or a p-n junction.

In accordance with the present invention, good passivation of layers xx4 and xx6 persists and/or improves after high temperature thermal treatment. Passivation may be adequate after deposition, but the high temperature thermal treatment can improve its character. The passivation is temperature-stable (from 500° C., or 600° C., or 700° C., to 1100° C. or more) because of the composition of the layers. Thermal treatment at 500° C. or more therefore comprises an aspect of the present invention. Other potential benefits of the structure may include: thermal treatment may not modify the crystallinity of the silicon substrate, at least at the interface, because the first interface layer is amorphous $SiO_2$, and/or because the conductive layer is SiC. Therefore another aspect of the present invention contemplates providing a thermal treatment without modifying the crystallinity of the silicon substrate, and/or that the interface passivation layer acts as a buffer for re-crystallization during thermal treatment.

If the layer composition is chosen correctly, a layer deposited in a single process can split into two (or more) layers. The incorporated oxygen in the amorphous deposited layer migrates toward the silicon interface and a thin oxide can be grown. If this mechanism is exploited by the use of oxide containing films xx3 and xx7, the passivating interface layers xx4 and xx6 do not need to be produced prior to layers xx3 and xx7, therefore all described structures can also work without layers xx4 and xx6. At the same time the film crystallizes and dopants may be activated. This effect can be employed to create structures such as cells 90 and 140 disclosed above, in a very short process flow, but it is not restricted to this application. For that reason layers xx3 and xx7 in all structures can be used to employ this mechanism if they contain a low amount of oxygen and the list of examples is expanded by the same layers containing oxygen.

Figure 18:
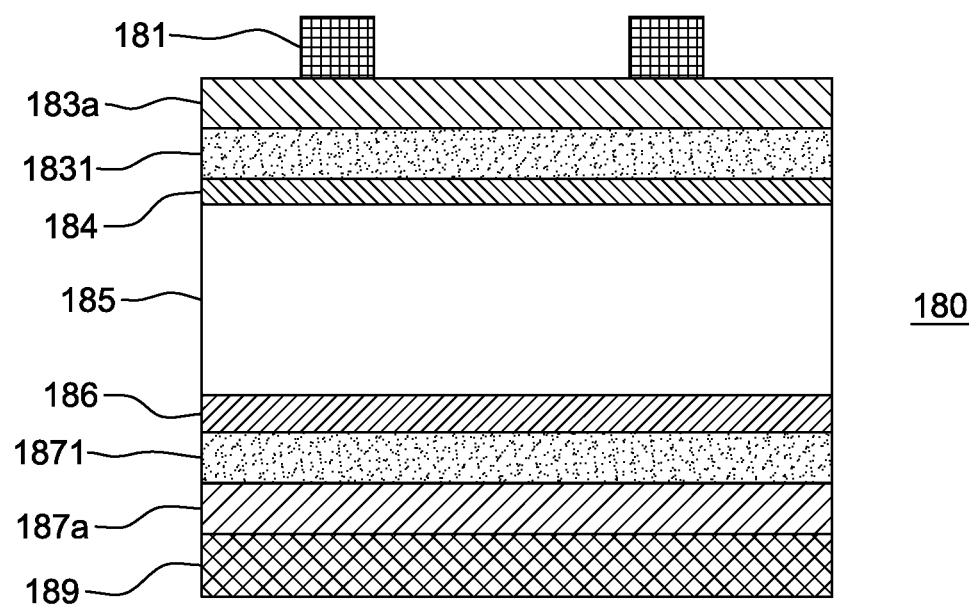
FIG. 18 is a partial cross-sectional view of a solar cell having additional silicon buffer layers formed therein, all in accordance with the present invention.

In case the passivating interface layers xx4 and xx6 and the highly doped layers xx3 and xx7 were deposited or grown with built-in stress, or the thermal treatment for crystallization described above creates stress, this can negatively affect the passivation properties of the wafer surface xx5. In order to prevent this negative effect, and with reference to the partial cross sectional view of solar cell 180 of FIG. 18 a thin silicon film 1831 and 1871 can be deposited on top of the passivation films 184 and 186, to act as a buffer layer. FIG. 18 illustrates this concept of a silicon buffer layers 1831 and 1871 between the passivation layers 184 and 186 and the highly doped layers 183a, and 187a, respectively. This concept is particularly beneficial for cells 90 and 140 disclosed above, but its application is not limited to these structures.

This silicon buffer layer can be, for example, undoped polysilicon. In this case, since the film can be deposited on both sides, a standard tube furnace can be used. In a process sequence where the passivation layers 184 and 186 are a thin thermal oxide, the process of oxidation can directly be followed by the deposition of polycrystalline silicon, in the same furnace but a different tube (saving handling of wafers) or even in the same tube. The doping needed for passivation can be produced by driving dopants incorporated in films 183a and 187a, with the temperature treatment used for crystallization at the same time drives the dopants from layers 183a and 187a into layers 1831 and 1871 respectively, making them passivating and conductive. The allowed thickness of the buffer layer depends on the doping level of the doped layers which are deposited on top as well as on the time/temperature profile that is used for crystallization of this doped top layer. The undoped layer is doped during this thermal treatment by the doped layers 183a and 187a. The buffer layers 1831 and 1871 can also be composed of multiple silicon layers.

Another effect of the thermal treatment is the re-organization of the passivating interface layers 184 and 186. Depending on their thickness, the thermal treatment and the layers over them, these layers shrink and via-holes open (e.g., perforation occurs) such that the adjacent layers 1831 and 1871 can make contact to the wafer 185 directly. A very small fraction of the interface allows the carriers to bypass the layers 184 and 186. If the thermal treatment is chosen in a way that no or insufficient via-holes open up, the layers 184 and 186 need to be thin enough to allow for tunneling of the carriers.

Other aspects of the present invention include improved methods of metallization fabrication. In one example, metallization for any of the above structures can be formed in accordance with previously filed U.S. Provisional Application entitled "Method for Forming Structures in a Solar Cell," filed 21 Apr. 2009 and assigned application No. 61/171,187; and to commonly-assigned, co-filed International Patent Application entitled "Method for Forming Structures in a Solar Cell," assigned application number PCT/US2010/123976. Each of these Applications is hereby incorporated by reference herein in its entirety. According to these Applications, metallization may be formed according to a method of forming a conductive contact/heterocontact pattern on a surface of solar cell, including forming a thin conductive layer over at least one lower layer of the solar cell, and ablating a majority of the thin conductive layer using a laser beam, thereby leaving behind the conductive contact/heterocontact pattern. A self-aligned metallization may be formed on the conductive contact pattern. The lower layer may include a passivation and/or antireflective layer beneath the thin conductive layer, wherein the conductive contact pattern forms an electrical contact through the at least one lower layer to a semiconductor layer of the solar cell.

In another example, metallization for any of the above structures can be formed in accordance with previously filed U.S. Provisional Application entitled "Localized Metal Contacts By Localized Laser Assisted Reduction Of Metal-Ions In Functional Films, And Solar Cell Applications Thereof," filed 22 Apr. 2009 and assigned application No. 61/171,491; and to commonly-assigned, co-filed International Patent Application entitled "Localized Metal Contacts By Localized Laser Assisted Conversion Of Functional Films In Solar Cells," assigned application number PCT/US2010/031881. Each of these Applications is hereby incorporated by reference herein in its entirety. According to these Applications, metallization may be formed according to a method of forming at least one electrical contact in a layer of a solar cell, including forming a layer in the solar cell comprising a material which can be selectively modified to electrical contacts upon laser irradiation; and applying selective laser irradiation to at least one area of the layer to thereby form at least one electrical contact in the area of the layer. A remaining region of the layer may comprise a functional layer of the solar cell and need not be removed; e.g., a transparent, conductive film, and anti-reflective film, and/or passivation as disclosed above.

The present invention extends to any one or a combination of the solar cell structures disclosed above, including generally a central substrate, conductive layer(s), antireflection layers(s), passivation layer(s) and/or electrode(s). The structures above are not mutually exclusive, and any feature of one structure, can apply to any other structure herein, in accordance with the present invention.

The present invention includes methods of fabricating any of these structures, including: providing a wafer as a central substrate; deposition or growth of interface passivation layers xx4 and xx6 over the substrate; deposition of conductive layers xx3 and xx7 over the passivation layers; providing thermal treatment; optional deposition of antireflective layers xx2 and xx8 (including possibly a low reflective index layer for a good internal mirror on the back); and providing metallization as electrodes.

In one embodiment the present invention comprises applying a heat treatment to produce a multifunctional film which separates into a surface passivating interface layer and a highly doped polycrystalline passivation layer with high transparency.

In one embodiment the present invention comprises depositing an amorphous, silicon containing compound and using a heat treatment in order to initiate crystallization into a polycrystalline film.

In one embodiment the present invention comprises depositing an amorphous, silicon containing compound and using a heat treatment which leads to a crystallization of the film and increases the optical transmissivity.

In one embodiment the present invention comprises depositing an amorphous, silicon containing compound and using a heat treatment in order to activate doping atoms in the compound.

In one embodiment, the present invention comprises depositing an amorphous, silicon containing compound and using a thermal treatment greater than 500° C. in order to activate doping atoms in the compound and result in diffusion of dopant atoms into a substrate wafer to provide a high-low junction or a p-n junction.

One or more of the process control aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams and steps depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a solar cell, comprising:
   providing a substrate;
   providing an interface passivation layer over the substrate;
   providing a passivating film over the interface passivation layer, the passivating film comprising a passivating material and a conductive dopant;
   wherein providing the interface passivation layer and providing the passivating film comprise:
   providing an amorphous silicon-containing compound over an upper surface of the substrate, the compound comprising oxygen dopant and the conductive dopant;
   thermally treating the amorphous silicon-containing compound to diffuse the oxygen dopant, at least in part, into the upper surface of the substrate to form an oxide layer over the substrate, the oxide layer defining the interface passivation layer; and
   wherein remaining amorphous silicon-containing compound above the oxide layer defines the passivating film; and
   wherein the thermally treating also diffuses at least a portion of the conductive dopant throughout the interface passivation layer to facilitate electrical connection to the substrate; and
   providing at least one electrode over the passivating film, wherein the conductive dopant within the passivating film and throughout the interface passivation layer provides direct electrical connection between the at least one electrode and the substrate.

2. The method of claim 1, wherein the thermally treating crystallizes, at least in part, the passivating film to establish a crystallized passivating film.

3. The method of claim 2, wherein the crystallized passivating film is a transparent film.

4. The method of claim 2, wherein the crystallization of the passivating film improves a passivation of the passivating film.

5. The method of claim 2, wherein the interface passivation layer protects the substrate from crystallization or re-crystallization during the thermally treating and crystallization of the passivating film.

6. The method of claim 1, wherein the interface passivation layer has a thickness selected to permit tunneling of electrical carriers through the interface passivation layer into the substrate.

7. The method of claim 1, wherein the thermally treating diffuses a portion of the conductive dopant through the interface passivation layer into the substrate.

8. The method of claim 1, further comprising providing an anti-reflective film over the conductive upper surface of the passivating film.

9. The method of claim 1, wherein the at least one electrode only electrically connects to the substrate through the passivating film via the conductive dopant.

* * * * *